(12) United States Patent
Gomm

(10) Patent No.: US 8,289,806 B2
(45) Date of Patent: Oct. 16, 2012

(54) MULTIPLE DEVICE APPARATUS, SYSTEMS, AND METHODS

(75) Inventor: Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 257 days.

(21) Appl. No.: 12/163,856

(22) Filed: Jun. 27, 2008

(65) Prior Publication Data

US 2009/0323456 A1   Dec. 31, 2009

(51) Int. Cl.
*G11C 8/18* (2006.01)
*H03L 7/06* (2006.01)

(52) U.S. Cl. .................... 365/233.1; 327/158

(58) Field of Classification Search ................ None
See application file for complete search history.

(56) References Cited

U.S. PATENT DOCUMENTS

| | | | |
|---|---|---|---|
| 6,977,655 B2 * | 12/2005 | Ryan | 345/533 |
| 2006/0233012 A1 * | 10/2006 | Sekiguchi et al. | 365/51 |
| 2008/0204091 A1 * | 8/2008 | Choo et al. | 327/149 |

* cited by examiner

*Primary Examiner* — Huan Hoang
*Assistant Examiner* — James G Norman
(74) *Attorney, Agent, or Firm* — Schwegman, Lundberg & Woessner, P.A.

(57) ABSTRACT

Apparatus, systems, and methods are disclosed that operate to generate a clock signal in a die in a stack and to receive the clock signal in another die in the stack. Additional apparatus, systems, and methods are disclosed.

30 Claims, 5 Drawing Sheets

MULTIPLE DEVICE APPARATUS, SYSTEMS, AND METHODS

BACKGROUND

Integrated circuit devices, including memory devices, often are used in computers and other electronic products, e.g., digital televisions, digital cameras, and cellular phones, to store data and other information. Multiple integrated circuit devices are often used together in a system.

DETAILED DESCRIPTION

Systems including multiple devices typically generate a clock signal in each device, and each device generating a clock signal consumes a substantial amount of power to do so. The inventors have discovered that the challenges noted above, as well as others, can be addressed by distributing a clock signal from a delay-locked loop (DLL) or a phase-locked loop (PLL) or multiple DLLs or PLLs in one or more integrated circuit dies to a collection of integrated circuit dies. Other DLLs or PLLs in the collection can be shut off to reduce power consumption.

Figure 1:
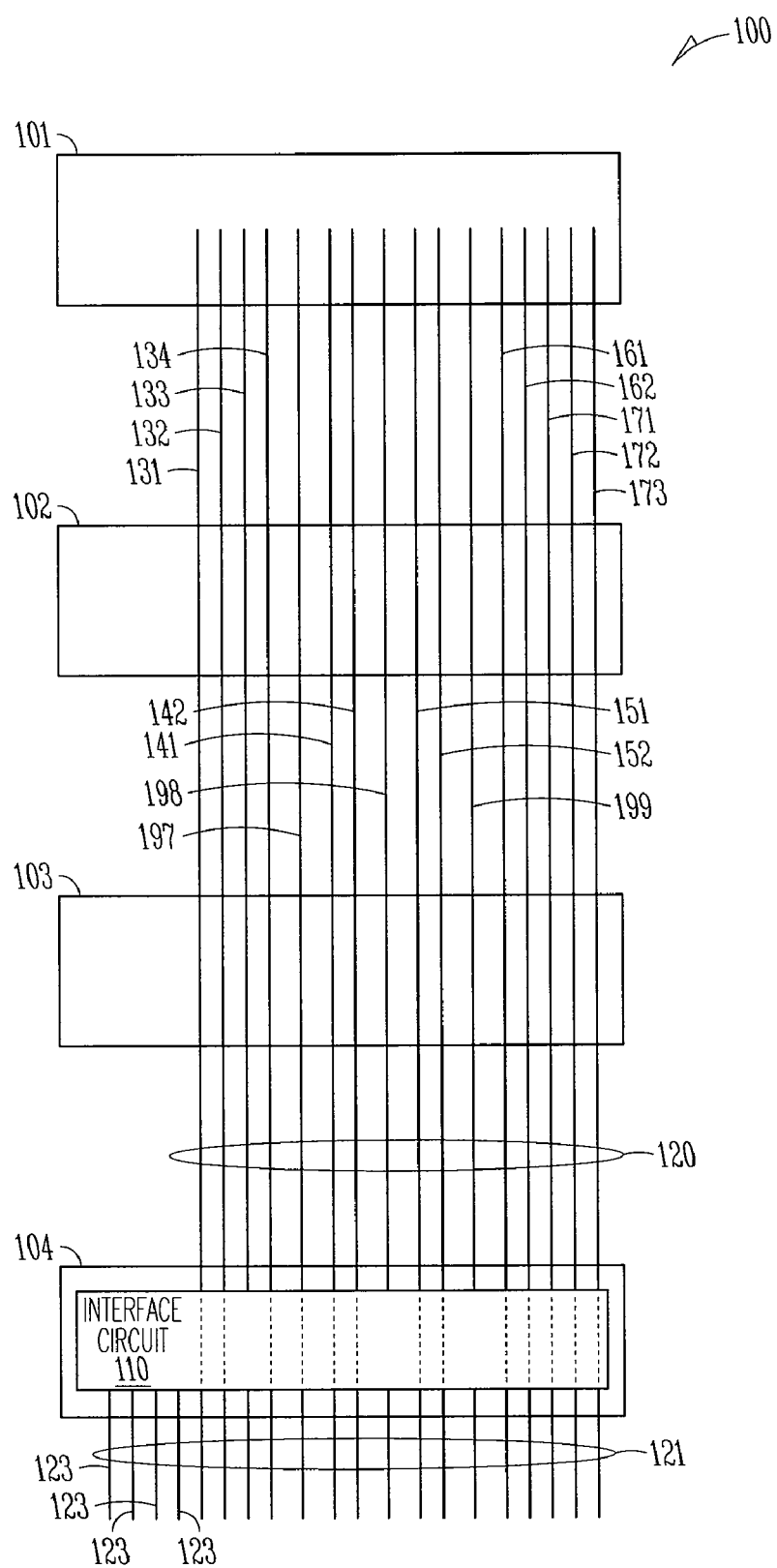
FIG. 1 is a block diagram of a stack including integrated circuit dies and channels according to various embodiments of the invention.

FIG. 1 is a block diagram of a stack 100 including integrated circuit dies (dies) and channels according to various embodiments of the invention. A stack of dies includes a collection or plurality of dies coupled together to exchange data, address, and control signals. The stack 100 includes several separate dies 101, 102, 103, and 104 and groups 120 and 121 of channels to transfer information. Each of the dies 101, 102, 103, and 104 is formed of semiconductor material and includes electronic circuitry. The dies 101, 102, 103, and 104 may communicate with each other through the channels in the group 120 and with other external devices such as a processor, a memory controller, or another device through an interface circuit 110 in the die 104. The interface circuit 110 may be a logic circuit. The channels in the groups 120 and 121 extend through or into the dies 101, 102, 103, and 104 in the stack 100. The dies 101, 102, 103, and 104 may have a different order, arrangement, or orientation with respect to each other in the stack 100 according to various embodiments of the invention. The stack 100 may include more or fewer dies according to various embodiments of the invention.

Information such as one or more of data, address, and control information or other information may be transferred through the channels in the groups 120 and 121. The group 120 includes multiple channels 131, 132, 133, 134, 141, 142, 151, 152, 161, 162, 171, 172, 173, 197, 198, and 199, and may include more channels. The channels in the group 121 include the channels 131-199 in the group 120 and additional channels 123. Information is transferred among the dies 101, 102, 103, and 104 through the channels 131-199 in the group 120, and information such as data and control information may also be transferred through the additional channels 123 between the interface circuit 110 and an external device such as a processor, a memory controller, or another device. Each of the channels 123-199 may be an electrically conductive path.

The channels 131-199 in the group 120 may be arranged into different buses to transfer different types of information. For example, the channels 131, 132, 133, and 134 may form a data bus to transfer information representing data to be stored in or read from the dies 101, 102, 103, and 104. The channels 141 and 142 may form an address bus to transfer information representing an address of a location in the dies 101, 102, 103, and 104 where data may be stored. The channels 151 and 152 may form a control bus to transfer control information to control operations of the stack 100. The channels 161 and 162 may form a power bus to provide power to the dies 101, 102, 103, and 104. For example, the channels 161 and 162 may carry voltages Vcc and Vss, where Vss can be a ground voltage reference. The channels 171, 172, 173, 197, 198, and 199 may be added to the above-described buses or be used for other purposes.

In various embodiments, a single DLL or PLL in one of the dies 101-104 in the stack 100 is operated to generate a clock signal that is distributed to others of the dies 101-104 in the stack 100 through one or more of the channels 131-199 in the group 120. Other DLLs or PLLs in the dies 101-104 are capable of being shut off to reduce power consumption in the stack 100. In various embodiments, two or more DLLs or PLLs in the stack 100 are operated to generate clock signals that are distributed to the dies 101-104 through two or more of the channels 131-199 in the group 120. Other DLLs or PLLs in the dies 101-104 can be shut off to reduce power consumption in the stack 100. In various embodiments, one or more of the dies 101-104 in the stack 100, such as the die 104, may operate a DLL or PLL to generate its own clock signal that is not distributed to others of the dies 101-104 in the stack 100.

The groups 120 and 121 shown in FIG. 1 include a specific number of channels as an example. The number of channels in the groups 120 and 121 may vary. For example, the group 120 may include tens, hundreds, or thousands of channels extending through or into the dies 101, 102, 103, and 104 in the stack 100.

The stack 100 shown in FIG. 1 may include only a single memory device or processor such that parts of the single memory device or processor may be distributed among the dies 101, 102, 103, and 104. The stack 100 may also include multiple memory devices or processors where each of the dies 101, 102, 103, and 104, by itself, includes a separate memory device or processor. The dies 101-104 may have a different order, arrangement, or orientation with respect to each other in the stack 100 according to various embodiments of the invention. The dies 101-104 may include processors and/or memory devices such as Flash memory devices, DRAMs, or SDRAMs. The dies 101-104 may be of the same design or may be of different designs.

Figure 2:
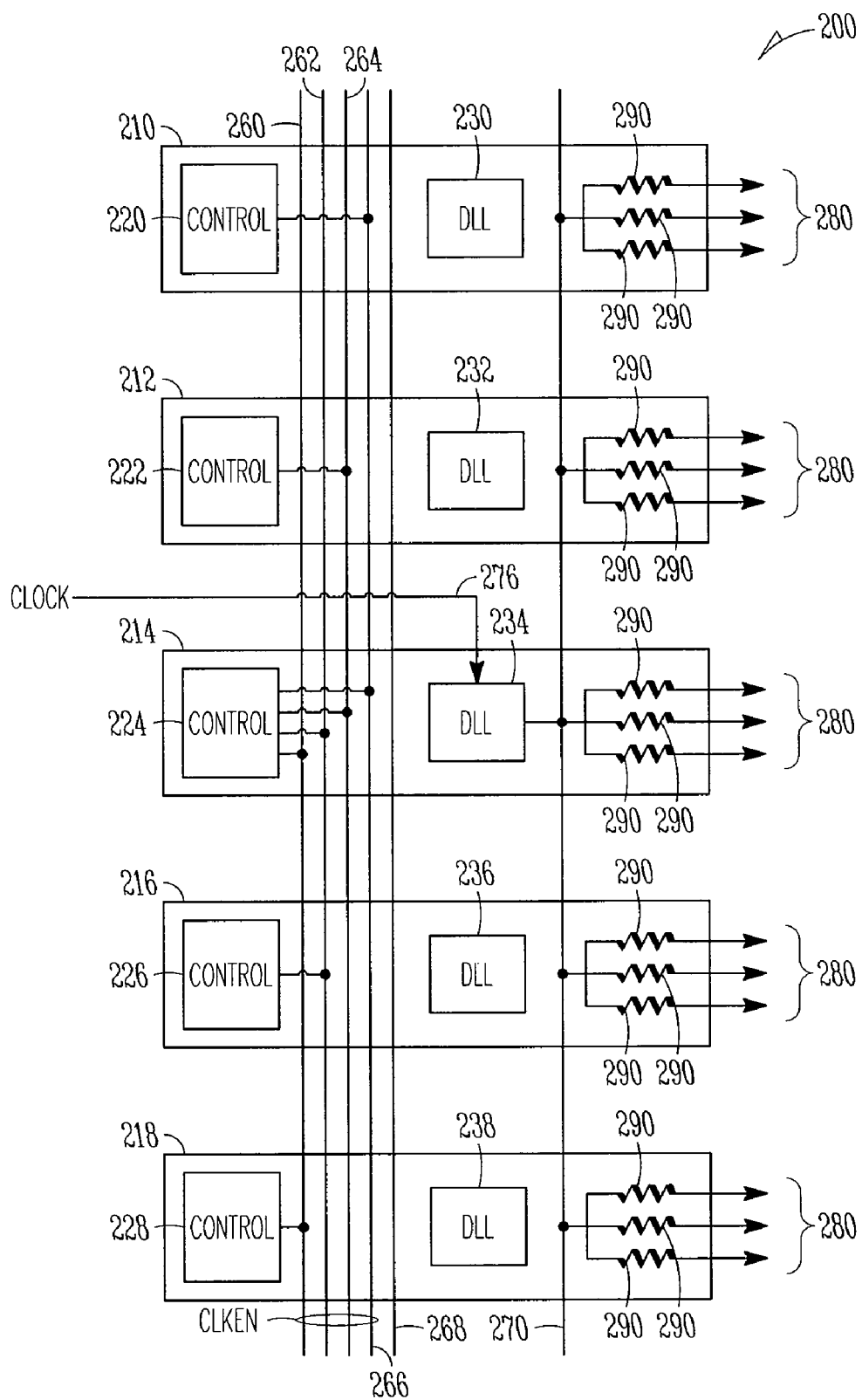
FIG. 2 is a block diagram of a stack including integrated circuit dies and channels according to various embodiments of the invention.

FIG. 2 is a block diagram of a stack 200 including integrated circuit dies and channels according to various embodiments of the invention. The stack 200 includes five separate integrated circuit dies 210, 212, 214, 216, and 218. Each of the integrated circuit dies 210, 212, 214, 216, and 218 is formed from a semiconductor material and includes electronic circuitry. Each of the dies 210, 212, 214, 216, and 218 includes a respective control circuit 220, 222, 224, 226, and 228 and a respective DLL 230, 232, 234, 236, and 238. The dies 210, 212, 214, 216, and 218 may include processors and/or memory devices such as Flash memory devices, DRAMs, or SDRAMs. The dies 210, 212, 214, 216, and 218 may be of the same design or may be of different designs.

The stack 200 includes several channels 260, 262, 264, 266, 268, and 270 to transfer information between the dies 210-218. The channels 260-270 may be electrically conductive paths. The channels 260-270 extend through or into the dies 210-218. The stack 200 may include more channels that are not shown.

DLLs such as the DLLs 230, 232, 234, 236, and 238 are used to generate an internal periodic signal such as an internal clock signal based on a periodic reference signal such as, for example, an external clock signal. Each DLL adjusts a phase of the internal periodic signal to maintain a specific phase relationship with the periodic reference signal. DLLs are used, for example, in high-speed clocked memories such as synchronous dynamic random access memory (SDRAM) devices. Each DLL consumes a substantial amount of power when operating to generate an internal periodic signal such as an internal clock signal.

In various embodiments, an internal clock signal generated by one of the DLLs 230, 232, 234, 236, and 238 is received by all of the dies 210-218 in the stack 200. In various embodiments, some, but not all, of the of the dies 210-218 in the stack 200 receive the internal clock signal. The internal clock signal may also be called a clock synchronization signal. The DLLs 230-238 not generating the internal clock signal are capable of being shut off to reduce power consumption. According to various embodiments of the invention shown in FIG. 2, the DLL 234 in the die 214 is coupled to receive an external clock signal on a line 276 and is operated to generate an internal clock signal by adjusting a phase of the internal clock signal to maintain a specific phase relationship with the external clock signal on the line 276. The die 214 may be called a generator die or a source die. The internal clock signal is available within the die 214 and is coupled from the DLL 234 to the channel 270 and thereafter distributed to one or more of the other dies 210, 212, 216, and 218 in the stack 200 through the channel 270. The dies 210, 212, 216, and 218 in the stack 200 receiving the internal clock signal may be called receiver dies.

The DLLs 230-238 not generating the internal clock signal may be shut off by gating the external clock signal off with, for example, a NAND gate. An enable/disable control line for each of the DLLs 230-238 may be set using a fuse or an antifuse.

Each of the dies 210, 212, 214, 216, and 218 includes a respective plurality of clock distribution terminals 280 in a clock distribution tree to distribute a clock signal generated by a DLL. Three clock distribution terminals 280 are shown extending from each of the dies 210, 212, 214, 216, and 218 from conductive lines that have a parasitic resistance 290 and a parasitic capacitance (not shown). Each clock distribution terminal 280 may be coupled to a data output terminal (not shown) such as, for example, a D-type flip-flop. More specifically, each clock distribution terminal 280 may be coupled to a clock input of a D-type flip-flop to clock data received at a D input through the D-type flip flop. The clock signal generated by a DLL may be distributed by straight line conductors or a T-shaped clock distribution structure according to various embodiments.

The dies 210-218 in the stack 200 may communicate a request for a clock signal with a clock enable (CLKEN) signal coupled to one or more of the channels 260-270. With respect to the various embodiments shown in FIG. 2, each die 210, 212, 216, and 218 may generate its own CLKEN signal to indicate to the die 214 that it is requesting the internal clock signal for a purpose such as, for example, data transmission. The control circuit 224 may generate a CLKEN signal internally for the die 214 to indicate whether the die 214 itself will use the internal clock signal to be generated. The control circuit 220 in the die 210 may generate a CLKEN signal coupled to the channel 266. The control circuit 222 in the die 212 may generate a CLKEN signal coupled to the channel 264. The control circuit 226 in the die 216 may generate a CLKEN signal coupled to the channel 262. The control circuit 228 in the die 218 may generate a CLKEN signal coupled to the channel 260. The channel 268 may be used for a purpose unrelated to the internal clock signal.

The die 214 is coupled to the channels 260-266 to receive the CLKEN signals from the dies 210, 212, 216, and 218. One or more of the dies 210-218 may be in an idle state in which it is not performing tasks that use the internal clock signal. The control circuit 224 in the die 214 receives the CLKEN signals on the channels 260-266 from the dies 210, 212, 216, and 218 and instructs the DLL 234 to generate the internal clock signal when at least one of the dies 210, 212, 214, 216, and 218 requests it. The DLL 234 can be shut off when none of the dies 210-218 requests the internal clock signal to perform an operation. The channels 260-270 between the dies 210, 212, 214, 216, and 218 are short enough such that clock skew and clock jitter resulting from the distribution of the clock signal across the dies 210-218 do not substantially impact performance.

In various embodiments, each of the dies 210-218 in the stack 200 may include a PLL rather than a DLL to generate an internal clock signal. PLLs are used to generate an internal periodic signal such as an internal clock signal based on a periodic reference signal such as, for example, an external clock signal. A PLL adjusts a phase of the internal periodic signal with an oscillator to maintain a specific phase relationship with the periodic reference signal. PLLs are used, for example, in high-speed clocked memories such as synchronous dynamic random access memory (SDRAM) devices. A PLL may be shut off with an enable/disable control line that would either keep the oscillator in a reset state or set an oscillator voltage to zero volts. An enable/disable control line for each of the PLLs may be set using a fuse or an antifuse. In various embodiments, the dies 210-218 in the stack 200 may include an assortment of PLLs and DLLs to generate internal clock signals.

In various embodiments, two or more DLLs or PLLs in the stack 200 are operated to generate clock signals that are distributed to the dies 210-218 through two or more of the channels 260-270. Other DLLs or PLLs in the dies 210-218 are capable of being shut off to reduce power consumption in the stack 200. One of the dies 210-218 having a DLL or PLL operated to generate a clock signal may be called a generator die or a source die. Another of the dies 210-218 having a DLL or PLL operated to generate a clock signal may be called an auxiliary die operated to generate an auxiliary clock signal.

The dies 210-218 may have a different order, arrangement, or orientation with respect to each other in the stack 200 according to various embodiments. The stack 200 may include more or fewer dies according to various embodiments. In various embodiments, one or more of the dies 210-218 in the stack 200 include a DLL or a PLL, and others of the dies 210-218 do not include a DLL or a PLL. The dies 210-218 may communicate with other external devices such as a processor, a memory controller, or another device through an interface circuit (not shown).

Figure 3:
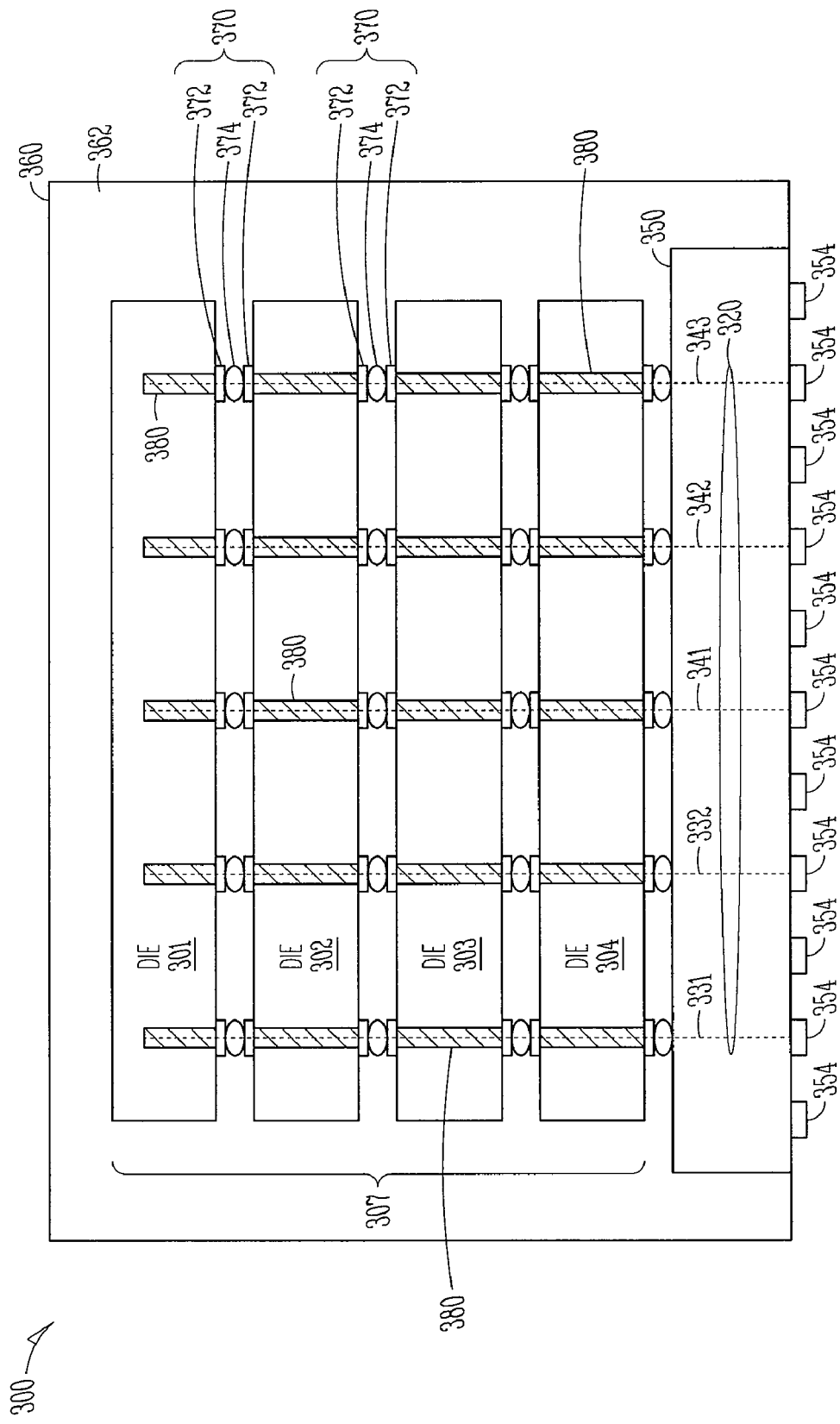
FIG. 3 is a partial cross section of an integrated circuit package having multiple separate integrated circuit dies arranged in a stack according to various embodiments of the invention.

FIG. 3 is a partial cross section of an integrated circuit package 300 having multiple separate integrated circuit dies 301, 302, 303, and 304 arranged in a stack 307 according to various embodiments of the invention. Each of the integrated circuit dies 301, 302, 303, and 304 is formed from a semiconductor material and includes electronic circuitry. The dies 301-304 may each include circuit components of a single memory device or a single processor. Alternatively, the dies 301-304 collectively may include circuitry of a memory device or a processor.

The package 300 includes a group 320 of channels 331, 332, 341, 342, and 343. Each channel 331, 332, 341, 342, and 343 is shown as a broken line in FIG. 3 that extends through or into the dies 301, 302, 303, and 304 in the stack 307. Each channel 331, 332, 341, 342, and 343 may be a conductive path and may be referred to as a "through wafer interconnect" (TWI) or a "through silicon via" (TSV).

The package 300 includes a support 350 coupled to the dies 301-304. The support 350 may be a ceramic or organic package substrate. Multiple contacts 354 are coupled to the support 350 to enable the dies 301-304 to communicate with another device such as a processor or a memory controller. Some of the contacts 354 may form portions of the channels 331, 332, 341, 342, and 343. The package 300 includes an enclosure 360 which may enclose at least a part of the support 350 and the dies 301-304. An interior space 362 between the enclosure 360 and the dies 301-304 may be filled with a filling material, a gas, a liquid, or a combination thereof. The filling material may include a polymer material.

An interface circuit (not shown) may be located in the die 304, and this interface circuit may be a logic circuit and may be similar to or identical to the interface circuit 110 shown in FIG. 1. The interface circuit may include circuit components, for example buffers and I/O drivers, to facilitate the transfer of information at appropriate data transfer rates between the dies 301, 302, 303, and 304 and another device such as a processor or a memory controller (not shown).

The dies 301-304 can be substantially equal in size and are stacked vertically on, or with respect to, the support 350. In other words, the dies 301-304 are stacked along a line substantially perpendicular to a larger surface of the support 350. The dies 301-304 may have a different order, arrangement, or orientation with respect to the support 350 and/or to each other according to various embodiments of the invention.

The dies 301-304 may be formed separately and then arranged in the stack 307 as shown in FIG. 3. The dies 301-304 are attached to each other at a number of joints 370. Each joint 370 is located between two of the dies 301-304. Each joint 370 includes two bond pads 372, one bond pad 372 being adhered to each respective die 301-304, and an electrically conductive material 374 between the bond pads 372. The conductive material 374 may include one or more of solder, copper, or a conductive adhesive.

Each channel 331, 332, 341, 342, and 343 includes at least one via 380 with a conductive material inside the via 380 that extends into or through one of the dies 301, 302, 303, and 304. A via 380 in one of the dies 301-304 is coupled to a via 380 in another one of the dies 301-304 through one of the joints 370 that couple distal ends of the vias 380 to each other. The vias 380 extend all the way through some of the dies 302, 303, and 304 and extend into, but not through, the die 301 at one end of the stack 307. Each channel 331, 332, 341, 342, and 343 includes selected ones of the vias 380 extending through the dies 302, 303, and 304 and into the die 301 coupled together by the joints 370. The conductive material inside the vias 380 may include one or more of solder, copper, or another conductive material.

The stack 307 may be formed in a flip-chip fashion in which the die 301 is used as a base as shown in FIG. 3. The die 302 is attached to the die 301, the die 303 is then attached to the die 302, and finally the die 304 is attached to the die 303. The conductive material 374 is used to bond the bond pads 372 of one die to the bond pads 372 of another die while the dies 301, 302, 303, and 304 are assembled in the stack 307. After the dies 301, 302, 303, and 304 are assembled in the stack 307, they may be flipped over and then attached at the die 304 to the support 350. The package 300 may be assembled using other techniques according to various embodiments of the invention. The stack 307 may include more or fewer dies according to various embodiments of the invention.

In various embodiments, a single DLL or PLL in one of the dies 301-304 in the stack 300 is operated to generate a clock signal that is distributed to others of the dies 301-304 in the stack 300 through one or more of the channels 331, 332, 341, 342, and 343. The one of the dies 301-304 operated to generate the clock signal may be called a generator die or a source die, and the other ones of the dies 301-304 receiving the clock signal may be called receiver dies. Other DLLs or PLLs in the dies 301-304 can be shut off to reduce power consumption in the stack 300. In various embodiments, two or more DLLs or PLLs in the stack 300 are operated to generate clock signals that are distributed to the dies 301-304 through two or more of the channels 331, 332, 341, 342, and 343. A second one of the dies 301-304 operated to generate a clock signal may be called an auxiliary die operated to generate an auxiliary clock signal. Other DLLs or PLLs in the dies 301-304 are capable of being shut off to reduce power consumption in the stack 300. The dies 301-304 may include processors and/or memory devices such as Flash memory devices, DRAMs, or SDRAMs. The dies 301-304 may be of the same design or may be of different designs.

The stacks 100, 200, and 300 shown and described herein with reference to FIG. 1 through FIG. 3 are vertical stacks in which dies are arranged in a substantially linear orientation. The individual dies in a stack may be arranged on a planar surface such as a circuit board according to various embodiments of the invention. The individual dies in a stack may have any other order, arrangement, or orientation with respect to each other according to various embodiments.

Figure 4:
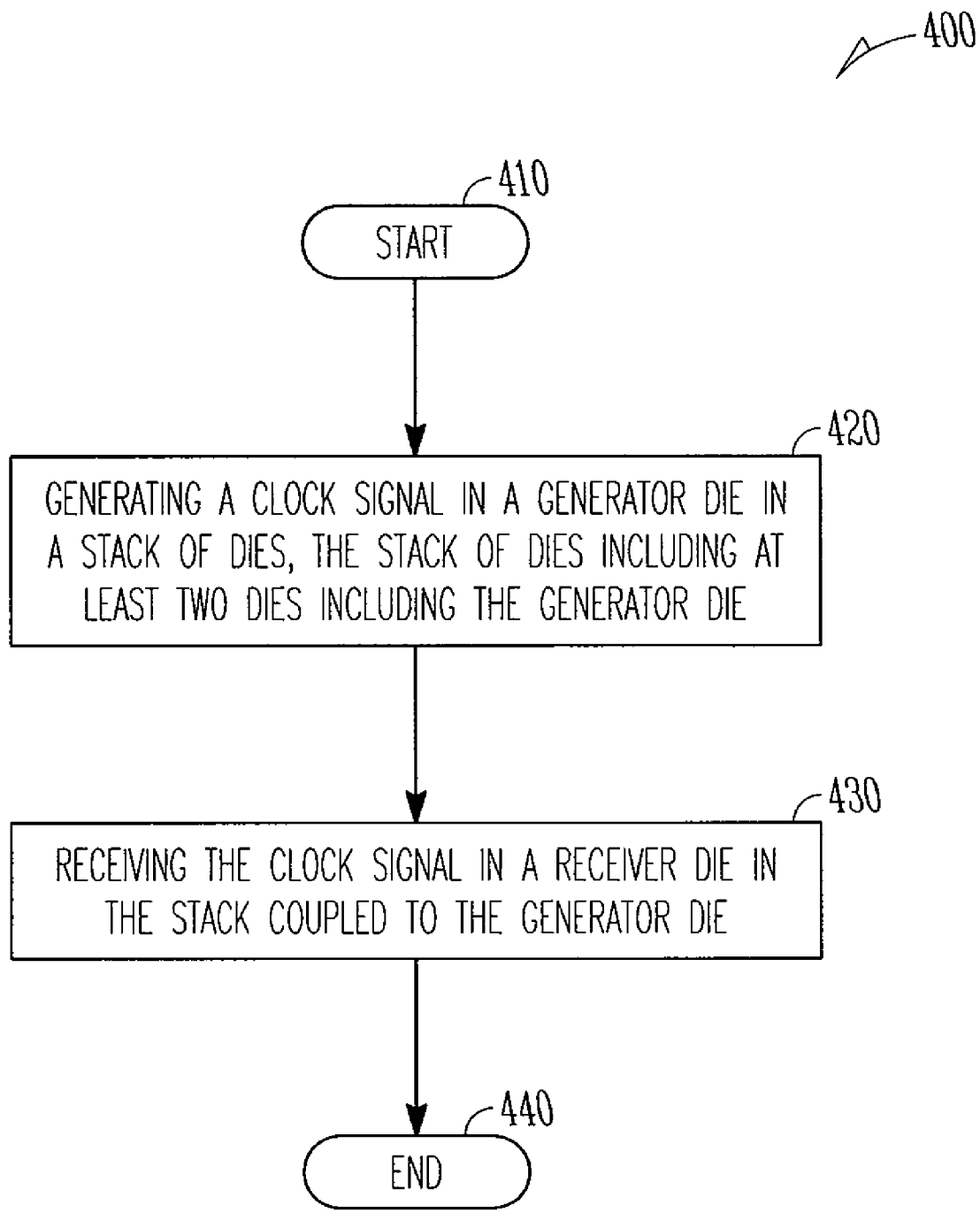
FIG. 4 is a flow diagram of operations or methods according to various embodiments of the invention.

FIG. 4 is a flow diagram of operations or methods 400 according to various embodiments of the invention. In block 410, the methods 400 start. In block 420, a clock signal is generated in a generator die in a stack of dies, the stack of dies including at least two dies including the generator die. In block 430, the clock signal is received in a receiver die in the stack coupled to the generator die. In block 440, the methods 400 end.

The individual activities of the operations or methods 400 do not have to be performed in the order shown or in any particular order. Some activities may be repeated, and others may occur only once. Various embodiments may have more or fewer activities than those shown in FIG. 4.

Figure 5:
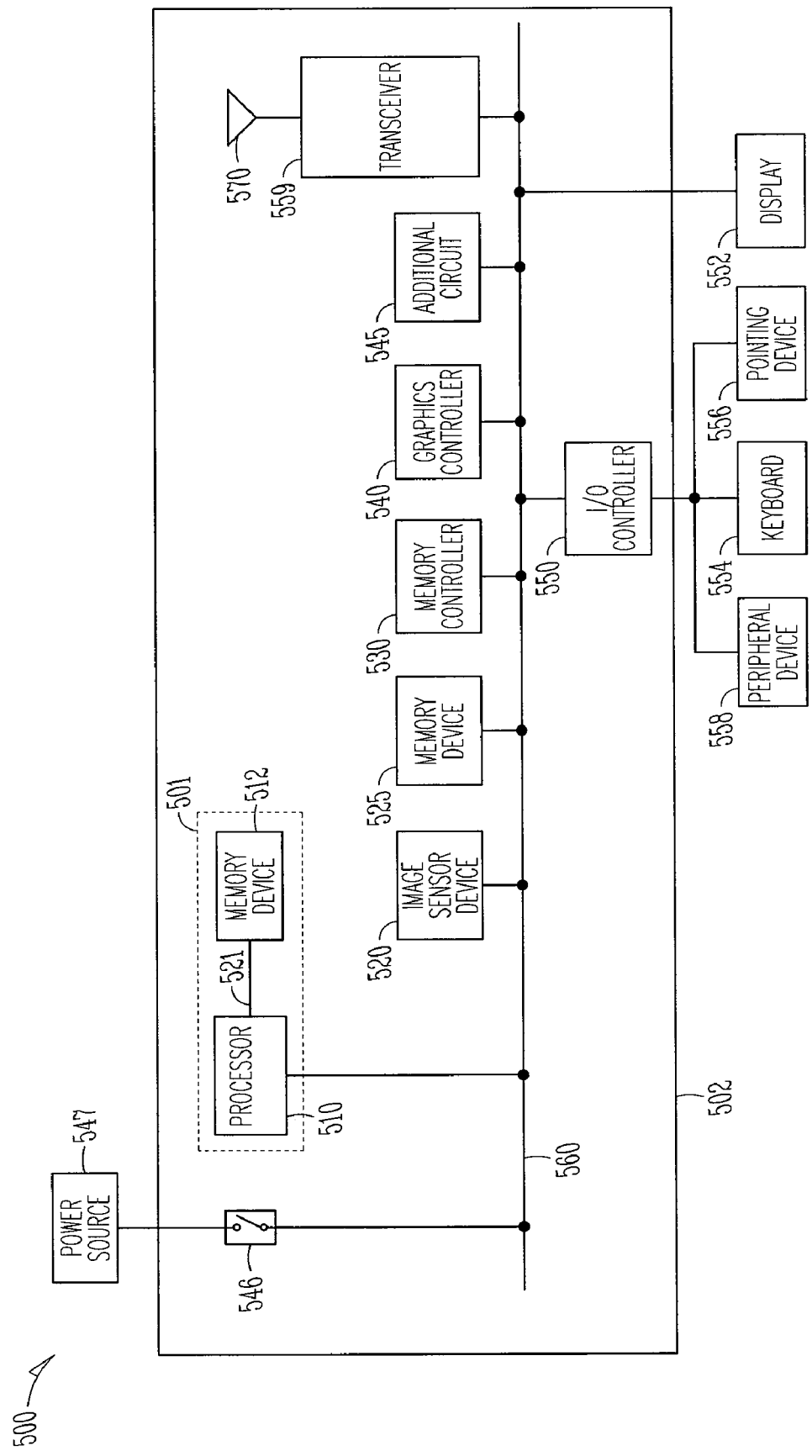
FIG. 5 is a block diagram of a system according to various embodiments of the invention.

FIG. 5 is a block diagram of a system 500 according to various embodiments of the invention. The system 500 may include a processor 510, a first memory device 512, an image sensor device 520, a second memory device 525, a memory controller 530, a graphics controller 540, an additional circuit 545, an input and output (I/O) controller 550, a display 552, a keyboard 554, a pointing device 556, a peripheral device 558, and a system transceiver 559. The system 500 may also include a bus 560 to transfer information among the components of the system 500 and to provide power to at least some of these components, a circuit board 502 where some of the components of system may be attached, and an antenna 570 to wirelessly transmit and receive information to and from the system 500. The transceiver 559 may operate to transfer information from one or more components of the system 500 such as the processor 510 or the memory device 525 to the antenna 570. The transceiver 559 may also operate to transfer information received at the antenna 570 to at least one of the processor 510 and the memory devices 525 and 512. Information received at the antenna 570 may be transmitted to the system 500 by a source external to the system 500.

The system 500 may also include a switch 546 such as a push button switch coupled to the bus 560 and a power source 547. The switch 546 may be engaged to couple power from the power source 547 to one or more of the components of system 500 such as the processor 510 or the memory device 512.

The processor 510 may include a general-purpose processor or an application specific integrated circuit (ASIC). The processor 510 may include a single core processor or a multiple-core processor. The processor 510 may execute one or more programming commands to process information. The information may include digital output information provided by other components of system 500 such as the image sensor device 520 or the memory device 525.

Each of the memory devices 525 and 512 may include a volatile memory device, a non-volatile memory device, or a combination of both. For example, the memory device 525 may comprise a dynamic random access memory (DRAM) device, a static random access memory (SRAM) device, a flash memory device, or a combination of these memory devices.

Each of the memory devices 525 and 512 and/or the processor 510 may be arranged in a stack of integrated circuit dies according to the various embodiments described herein, such as the stacks 100, 200, or 300 shown and described with reference to FIG. 1 through FIG. 3. Each of the memory devices 525 and 512 and/or the processor 510 may be operated according to the operations or methods 400 shown and described with reference to FIG. 4.

Some components of the system 500 may be arranged together such that the system 500 may include a system in package (SIP). For example, the memory device 512 and the processor 510 may be a part of a SIP 501 or the entire SIP 501 in which the memory device 512 may be used as a cache memory for the processor 510. The memory device 512 may be a level L1 cache, a level L2 cache, a level L3 cache, or a combination thereof. The processor 510 and the memory device 512 may communicate with each other through one or more channels 521.

The image sensor device 520 may include a complementary metal-oxide-semiconductor (CMOS) image sensor having a CMOS pixel array or charge-coupled device (CCD) image sensor having a CCD pixel array. The display 552 may include an analog display or a digital display. The display 552 may receive information from other components. For example, the display 552 may receive and display information such as text or images that is processed by one or more of the image sensor device 520, the memory device 525, the graphics controller 540, and the processor 510.

The additional circuit 545 may include circuit components used in a vehicle (not shown). The additional circuit 545 may receive information from other components to activate one or more subsystems of the vehicle. For example, the additional circuit 545 may receive information that is processed by one or more of the image sensor device 520, the memory device 525, and the processor 510 to activate one or more of an air bag system, a vehicle security alarm, and an obstacle alert system.

Clock signal distribution mechanisms presented herein may provide increased efficiency by reducing power consumption in a collection of dies. A clock signal from a DLL or a PLL or multiple clock signals from multiple DLLs or PLLs can be distributed through a collection of dies. One or more other DLLs or PLLs in the collection can be shut off to reduce power consumption. In addition, data may be clocked out of the dies according to the same clock signal. This can lead to a significant performance improvement.

Any of the circuits or systems described herein may be referred to as a module. A module may comprise a circuit and/or firmware according to various embodiments.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the claims. In addition, in the foregoing Detailed Description, it can be seen that various features are arranged together for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of one or more of the disclosed embodiments. Thus, the following claims are hereby incorporated into the Detailed Description, with each claim standing on its own as a separate embodiment.

What is claimed is:

1. A system comprising:
   a first die in a stack including three or more dice, the first die being coupled to receive a first clock enable signal and a second clock enable signal, the first die including a clock generator circuit to generate a clock signal in response to the first clock enable signal or the second clock enable signal;
   a second die in the stack to generate the first clock enable signal and being coupled to receive the clock signal from the first die to perform a first task using the clock signal from the first die while a clock generator circuit in the second die is shut off; and
   a third die in the stack to generate the second clock enable signal and being coupled to receive the clock signal from the first die to perform a second task using the clock signal from the first die while a clock generator circuit in the third die is shut off.

2. The system of claim 1, wherein the clock generator circuit in the first die is a delay-locked loop (DLL) or a phase-locked loop (PLL).

3. The system of claim 1, wherein:
   the stack includes four or more dice including the first die;
   each die in the stack includes a dynamic random access memory (DRAM) device or a flash memory device or a processor; and
   the stack includes a plurality of channels coupled to carry signals between the dice in the stack.

4. The system of claim 1, wherein:
   the first task is to clock data out of the second die; and
   the second task is to clock data out of the third die.

5. The system of claim 1, wherein:
   each die in the stack includes a clock generator circuit; and
   the clock generator circuit in each die in the stack other than the first die is capable of being shut off while the clock signal is being generated in the first die.

6. A method comprising:
   generating a first clock signal in a first die in a stack in response to clock enable signals from a plurality of dice in the stack;

receiving the first clock signal in a second die in the stack coupled to the first die while the second die is generating one of the clock enable signals;

shutting off a clock generator circuit in the second die;

performing a task in the second die using the first clock signal received from the first die;

receiving the first clock signal in a third die in the stack coupled to the first die while the third die is generating one of the clock enable signals;

shutting off a clock generator circuit in the third die; and performing a task in the third die using the first clock signal received from the first die.

7. The method of claim 6, further comprising receiving the first clock signal in a fourth die in the stack coupled to the first die while the fourth die is generating one of the clock enable signals.

8. The method of claim 6, wherein:
performing a task in the second die includes clocking data out of the second die; and
performing a task in the third die includes clocking data out of the third die.

9. The method of claim 6, wherein:
generating a first clock signal in a first die includes generating the first clock signal in a DLL (delay-locked loop) or a PLL (phase-locked loop) in the first die.

10. The method of claim 7, further comprising shutting off a DLL (delay-locked loop) or a PLL (phase-locked loop) in one or more dice in the stack other than the first die.

11. The method of claim 7, further comprising storing data in one or more dice in the stack that each include a memory device of the same design or issuing commands from one or more dice in the stack that each include a processor of the same design.

12. The method of claim 6, further comprising:
exchanging signals with devices outside the stack through an interface circuit in the stack, the interface circuit being formed in one of the dice.

13. A system comprising:
a plurality of integrated circuit dice arranged in a stack;
a plurality of channels coupled between the dice in the stack to carry signals among the dice;
a clock generator circuit in a first one of the dice to generate a first clock signal, the first clock signal being coupled to a second one of the dice in the stack through one or more of the channels;
a circuit to generate a clock enable signal in each of the dice other than the first die to be coupled through one or more of the channels to instruct the first die to generate the first clock signal; and
a clock generator circuit in each of the dice other than the first die, the clock generator circuit in one of the dice other than the first die to be switched off when the die other than the first die is performing a task using the first clock signal.

14. The system of claim 13, wherein a plurality of the dice each include a memory device having the same design.

15. The system of claim 13, wherein two of the dice in the stack have different designs.

16. The system of claim 13, wherein the stack includes four or more dice including the first die.

17. The system of claim 13, wherein each of a plurality of the dice in the stack includes a dynamic random access memory (DRAM) device or a flash memory device or a processor.

18. The system of claim 13, wherein each clock generator circuit is a DLL (delay-locked loop) or a PLL (phase-locked loop) coupled to receive an external periodic signal and to generate a clock signal from the external periodic signal.

19. The system of claim 13, wherein the circuit to generate a clock enable signal comprises a control circuit.

20. The system of claim 13, wherein one of the dice in the stack includes an interface circuit coupled through the channels to others of the dice in the stack, the interface circuit being coupled to communicate with devices outside the stack.

21. A method comprising:
storing data in one or more memory devices in a stack including integrated circuit dice, each memory device being formed in one of the integrated circuit dice;
reading data from one or more of the memory devices in the stack;
generating a clock signal in a selected one of the memory devices in the stack;
issuing a clock enable signal from each memory device in the stack that is to use the clock signal;
receiving each clock enable signal in the selected memory device to instruct the selected memory device to generate the clock signal; and
receiving the clock signal in memory devices in the stack other than the selected memory device.

22. The method of claim 21, further comprising exchanging signals with devices outside the stack through an interface circuit in the stack, the interface circuit being formed in one of the integrated circuit dice.

23. The method of claim 21, wherein each memory device comprises a DRAM (dynamic random access memory) device or a flash memory device.

24. The method of claim 21, wherein:
generating a clock signal in a selected one of the memory devices in the stack includes generating the clock signal in a DLL (delay-locked loop) or a PLL (phase-locked loop) in the selected memory device in the stack; and
further comprising switching off DLLs or PLLs in memory devices in the stack other than the selected memory device.

25. A semiconductor die stack comprising:
a first semiconductor die including a first clock generator circuit;
a second semiconductor die including a second clock generator circuit; and
a third semiconductor die including a third clock generator circuit, the first, second and third semiconductor dice coupled together with conductive interconnects, wherein during operation of the semiconductor die stack, when the second clock generator circuit and the third clock generator circuit are turned off, an output signal from the first clock generator circuit is coupled to the second semiconductor die and the third semiconductor die through at least one of the conductive interconnects in response to a clock enable signal from the second semiconductor die and a clock enable signal from the third semiconductor die.

26. The semiconductor die stack of claim 25, wherein the conductive interconnects are vias coupled together by joints.

27. The semiconductor die stack of claim 25, wherein:
the semiconductor die stack includes four or more dice including the first semiconductor die, the second semiconductor die and the third semiconductor die;
each die in the semiconductor die stack includes a DRAM (dynamic random access memory) device or a flash memory device or a processor;
each of the first, second and third clock generator circuits is a DLL (delay-locked loop) or a PLL (phase-locked loop)

coupled to receive an external periodic signal and to generate a periodic output signal from the external periodic signal;

during operation of the semiconductor die stack the conductive interconnects carry signals between the dice in the semiconductor die stack; and one of the dice in the semiconductor die stack includes an interface circuit coupled to communicate with devices outside the semiconductor die stack.

28. A stack of semiconductor memory devices comprising:

a first semiconductor memory die comprising a first clock generator circuit to generate an internal clock signal;

a second semiconductor memory die including a second clock generator circuit; and a third semiconductor memory die including a third clock generator circuit, the first, second and third semiconductor memory dice coupled together with conductive interconnects, wherein during operation of the stack of semiconductor memory devices the second clock generator circuit and the third clock generator circuit are turned off to conserve power and the internal clock signal generated by the first clock generator circuit is coupled to the second semiconductor memory die and the third semiconductor memory die through at least one of the conductive interconnects, and wherein at least two of the conductive interconnects are coupled to carry a first control signal from the second semiconductor memory die and a second control signal from the third semiconductor memory die to the first semiconductor memory die to instruct the first clock generator circuit to generate the internal clock signal.

29. The stack of semiconductor memory devices of claim 28, wherein the conductive interconnects are vias coupled together by joints.

30. The stack of semiconductor memory devices of claim 28, wherein:

the stack of semiconductor memory devices includes four or more dice including the first semiconductor memory die, the second semiconductor memory die and the third semiconductor memory die;

each semiconductor memory die in the stack of semiconductor memory devices includes a DRAM (dynamic random access memory) device or a flash memory device;

each of the first, second and third clock generator circuits is a DLL (delay-locked loop) or a PLL (phase-locked loop) coupled to receive an external periodic signal and to generate a periodic output signal from the external periodic signal;

during operation of the stack of semiconductor memory devices the conductive interconnects carry signals between the dice in the stack of semiconductor memory devices; and one of the dice in the stack of semiconductor memory devices includes an interface circuit coupled to communicate with devices outside the stack of semiconductor memory devices.

* * * * *